United States Patent [19]
Shimizu

[11] Patent Number: 6,007,376
[45] Date of Patent: Dec. 28, 1999

[54] CIRCUIT BOARD ELECTRICAL CONNECTOR

[75] Inventor: Shinji Shimizu, Tokyo, Japan

[73] Assignee: Hirose Electric Co., Ltd., Tokyo, Japan

[21] Appl. No.: 09/060,995

[22] Filed: Apr. 16, 1998

[30] Foreign Application Priority Data

Apr. 18, 1997 [JP] Japan .................................. 9-115074

[51] Int. Cl.$^6$ ................................................ H01R 13/73
[52] U.S. Cl. ........................... 439/571; 439/876; 29/840; 174/260
[58] Field of Search ..................... 439/571, 569, 439/570, 572, 751, 876, 83, 567; 29/840; 174/260

[56] References Cited

U.S. PATENT DOCUMENTS 5,074,807  12/1991  Parmer ................................. 439/571
5,238,413   8/1993  McCaffrey et al. .................... 439/571

*Primary Examiner*—Paula Bradley
*Assistant Examiner*—Katrina Davis
*Attorney, Agent, or Firm*—Kanesaka & Takeuchi

[57] ABSTRACT

A circuit board electrical connector for a circuit board having an attachment opening, which comprises a housing; an attachment leg having a metallic surface and projecting downwardly from the housing into the attachment opening; and a solder retention area in the attachment leg so that solder flows into an upper portion of the attaching opening.

3 Claims, 4 Drawing Sheets

CIRCUIT BOARD ELECTRICAL CONNECTOR

BACKGROUND OF THE INVENTION

1. Filed of the Invention

The present invention relates to circuit board electrical connectors.

2. Description of the Related Art

Japanese UM patent application Kokai No. 91071/92 discloses a circuit board electrical connector which comprises a contact element and an attaching leg, both bent in an L-shaped form so that their horizontal sections are brought into contact with a circuit trace and an attaching area on a circuit board for soldering. In FIG. 5, an opening 52 is provided in an attaching leg 51 so that the solder in the opening 52 increases the securing force. Similarly, in FIG. 6, a notch 54 is provided in an attaching leg 53.

In FIG. 7, an attaching leg 55 extends downwardly from a housing 56 through an attaching hole 58 of a circuit board 57, and solder is charged into the attaching hole 58 to secure the attaching leg 55 to the circuit board 57.

However, the attaching legs of FIGS. 5 and 6 not only tend to slide laterally prior to hardening of solder but also provide poor securing force. When the connector receives a large bending moment upon plugging, it is frequent that the soldering is broken.

In FIG. 7, the soldering has a strength higher than those of FIGS. 5 and 6, but it is still not fully satisfactory.

SUMMARY OF THE INVENTION

Accordingly, it is an object of the invention to provide a circuit board electrical connector with an improved attaching leg having a securing force higher than before.

According to the invention there is provided a circuit board electrical connector for a circuit board having an attaching opening, which comprises a housing; and an attaching leg having a metallic surface and projecting downwardly from the housing into the attaching opening. The attaching leg may be made of a metal or by plating a non-metal.

According to the invention, there is provided a solder retention area in the attaching leg so that solder flows into an upper portion of the attaching opening.

The solder is hardened in a solid form in the solder retention area. Since the solder flows into an upper space of the attaching opening, the securing force is increased to assure prevention of the attaching leg from coming off. The solid form of the hardened solder increases the strength against the bending moment caused by plugging in and out operations.

The attaching leg is made of a metal plate and the solder retention area is one of a notch and a hole or at least one curved portion of the attaching leg. It is easy to make the attaching leg with a metal plate.

The solder retention area is made of a recess provided in a surface of the attaching leg which has a sufficient thickness to accommodate the recess.

DESCRIPTION OF THE PREFERRED EMBODIMENT

Figure 1:
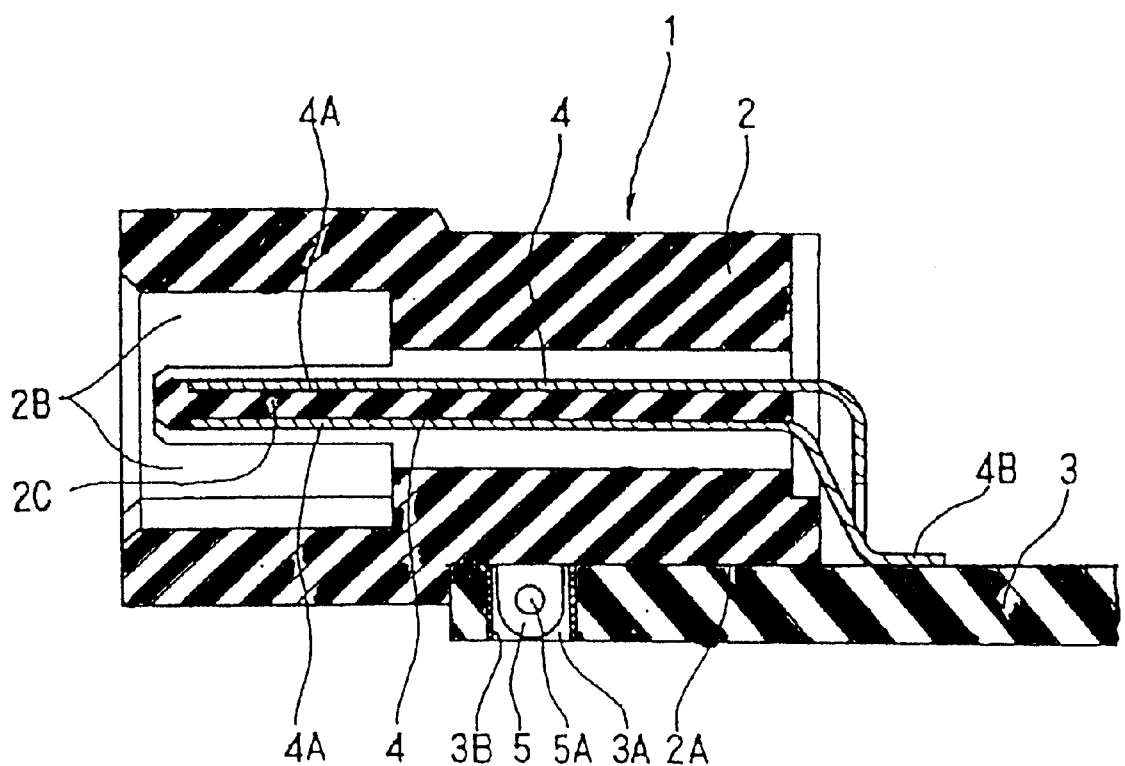
FIG. 1 is a sectional view of a connector according to an embodiment of the invention.

In FIG. 1, an electrical connector 1 has a substantially rectangular housing 2 made of an insulative material. The housing 2 has an attaching face 2A on the rear bottom for mounting the housing on a circuit board 3 and a front receiving cavity 2B for receiving a mating connector. A contact support 2C projects into the receiving cavity 2B and extends in a first direction perpendicular to the sheet to support a plurality of contact elements 4 on upper and lower surfaces at a constant pitch in the first direction. Each contact element 4 has a contact section 4A for contact with a contact element of the mating connector and a connection section 4B projecting rearwardly from the housing 2 and being bent in a substantially L-shaped form, with a rear end portion thereof connected to the circuit board. The connection sections 4B of upper and lower contact elements are offset by a half of the pitch so that they are arranged in the first direction at the half pitch.

The connector 1 has an attaching leg 5 made of a metal plate and projecting downwardly from the attaching surface 2A by a length substantially equal to the thickness of the circuit board 3. The attaching leg 5 is housed in an attaching slit 3A in the circuit board 3 so that it does not interfere with components provided on the back of the circuit board. A solder retention area or hole 5A is provided in the attaching leg 5. A metal layer 3B is provided on the inside of the attaching slit 3A for facilitating soldering. It is preferred that the metal layer 3B extends to the upper and lower surfaces of the circuit board 3.

How to attach the connector 1 to the circuit board 3 will be described.

(1) The connector 1 is placed on the circuit board 3 at a predetermined position by inserting the attaching leg 5 into the attaching slit 3A of the circuit board 3 so that the attaching surface 2A rests on the circuit board 3.

(2) The connection sections 4B of contact elements 4 and the attaching leg 5 are soldered to the circuit board.

(3) The attaching slit 3A is filled with solder so that the solder enters the solder retention hole 5A of the attaching leg 5 and works as a hook to prevent the attaching leg 5 from coming off from the slit 3A. Also, the solder is hardened in a solid form in the solder retention area so that it is sufficiently strong to withstand the bending moment acting on the attaching leg 5 upon plugging in and out operations.

Figure 2:
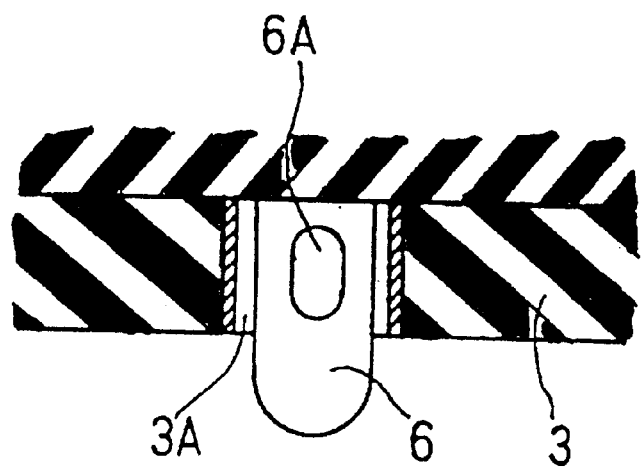
FIG. 2 is a side view of an attaching leg according to second embodiment of the invention.
Figure 3:
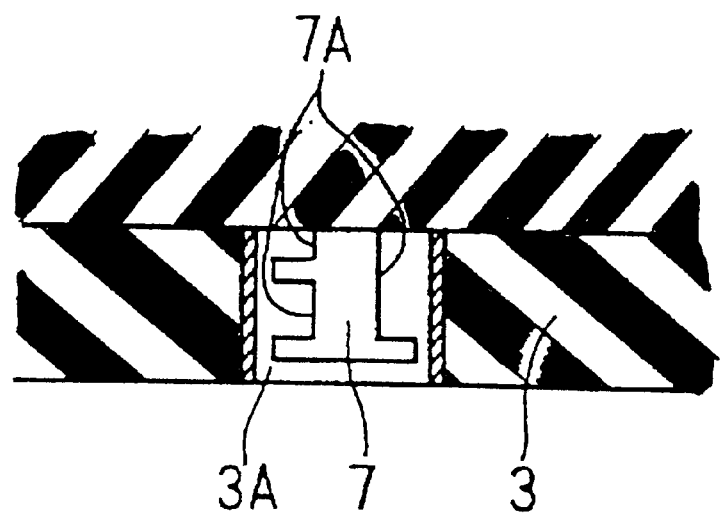
FIG. 3 is a side view of an attaching leg according to third embodiment of the invention.

In FIG. 2, an attaching leg 6 projects from the attaching slit 3A so that a large solder retention area or hole 6A is provided to accommodate a large amount of solder, increasing the securing force. Since the attaching leg 6 projects from the circuit board 3, it is necessary to design the circuit board so that it does not interfere with surrounding components. In FIG. 3, an attaching leg 7 is provided with solder retention area or notches 7A to produce similar effects.

Figure 4:
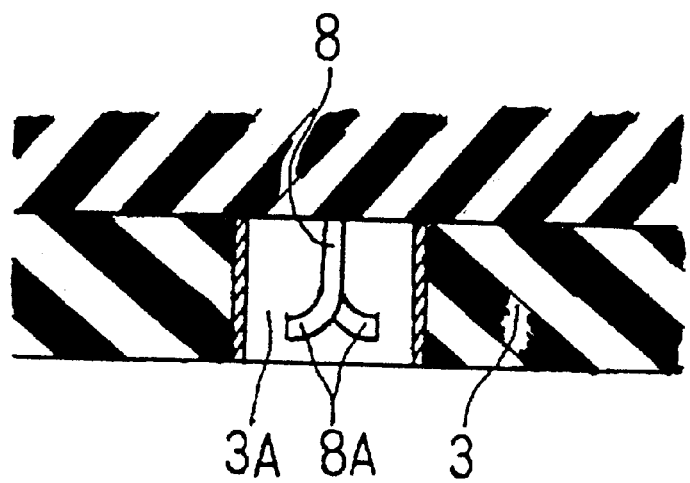
FIG. 4 is a side view of an attaching leg according to fourth embodiment of the invention.
Figure 5:
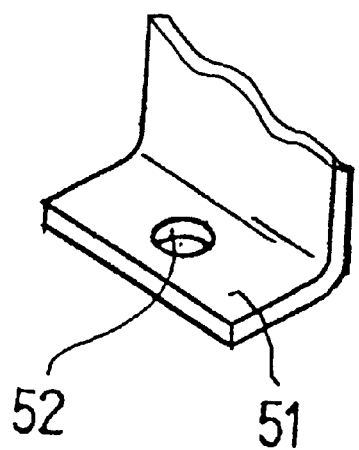
FIG. 5 is a perspective view of a conventional attaching leg for a connector.
Figure 6:
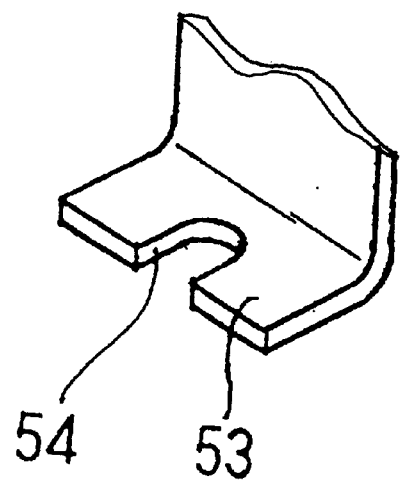
FIG. 6 is a perspective view of an another conventional attaching leg for connector.
Figure 7:
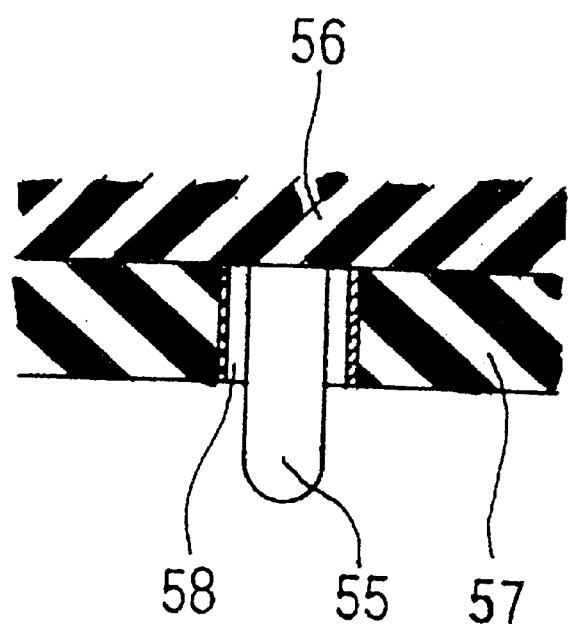
FIG. 7 is a perspective view of a yet another conventional attaching leg for connector.

In FIGS. 1–3, the attaching legs are flat but, in FIG. 4, an attaching leg 8 has a pair of leg portions 8A curved in opposite directions to form a solder retention area thereby producing a large securing force.

If an attaching leg is not flat but cylindrical, a recess may be provided in the cylindrical leg to provide a solder retention area.

As has been described above, according to the invention there is provided a solder retention area so that the hardened solder is hooked by the retention area to maximize the securing force. Since the solder holds the attaching leg in a solid form in the solder retention area, both high securing force and high resistance to the bending moment are provided.

What is claimed is:

1. A circuit board electrical connector mounted on a circuit board having an attaching opening, comprising:

a housing having a receiving cavity to receive a mating connector;

a plurality of contact elements having a contact section for contact with a contact element of a mating connector and a connection section to be connected to said circuit board;

an attaching leg made of a metal plate and projecting downwardly from the housing into said attaching opening, wherein said attaching leg has a width smaller than a diameter of said attaching opening so that said attaching leg is movable in said attaching opening; and a solder retention hole provided in said attaching leg so that solder flows into an upper portion of said attaching leg and enters into said solder retention hole.

2. A circuit board electrical connector according to claim 1, wherein said attaching leg is positioned between said contact section and said connection section, thus preventing said connection section from receiving damage caused by a shock produced at said contact section upon engagement between said contact section and said contact element of said mating connector.

3. A circuit board electrical connector according to claim 1, wherein said solder retention hole provided in said attaching leg is positioned within a depth of said attaching opening, thus providing a firm securing force.

* * * * *